(12) United States Patent  (10) Patent No.: US 8,554,717 B2
Reckmann et al.  (45) Date of Patent: Oct. 8, 2013

(54) RISK ASSESSMENT FOR TOOLS

(75) Inventors: Hanno Reckmann, Nienhagen (DE); Dustin R. Garvey, Houston, TX (US)

(73) Assignee: Baker Hughes Incorporated, Houston, TX (US)

( * ) Notice: Subject to any disclaimer, the term of this patent is extended or adjusted under 35 U.S.C. 154(b) by 537 days.

(21) Appl. No.: 12/834,317

(22) Filed: Jul. 12, 2010

(65) Prior Publication Data

US 2011/0022554 A1  Jan. 27, 2011

Related U.S. Application Data

(60) Provisional application No. 61/227,525, filed on Jul. 22, 2009.

(51) Int. Cl.
*G06F 15/18* (2006.01)
*G06F 17/00* (2006.01)
*G06N 5/04* (2006.01)

(52) U.S. Cl.
USPC .......................................................... 706/61

(58) Field of Classification Search
USPC ................. 706/17, 16, 15, 45, 59, 61, 62
See application file for complete search history.

(56) References Cited

U.S. PATENT DOCUMENTS

| | | | |
|---|---|---|---|
| 4,852,399 A | 8/1989 | Falconer | |
| 5,660,239 A | 8/1997 | Mueller | |
| 6,443,242 B1 | 9/2002 | Newman et al. | |
| 6,648,082 B2 * | 11/2003 | Schultz et al. | 175/39 |
| 6,681,633 B2 * | 1/2004 | Schultz et al. | 73/587 |
| 6,691,802 B2 * | 2/2004 | Schultz et al. | 175/56 |
| 6,712,160 B1 * | 3/2004 | Schultz et al. | 175/48 |
| 6,722,450 B2 * | 4/2004 | Schultz et al. | 175/39 |
| 2004/0182606 A1 | 9/2004 | Goldman et al. | |
| 2008/0128138 A1 * | 6/2008 | Radi | 166/350 |
| 2009/0076873 A1 * | 3/2009 | Johnson et al. | 705/8 |

OTHER PUBLICATIONS

Hochrein et al, "A Nondestructive Evaluation Technique for Detecting the Incipient Failure of Drill Pipes Used in Geothermal Well Drilling", Radian Corporation Austin, Texas, Geothermal Systems Materials: A Workhop/Symposium Proceedings, May 23-25, 1978.*
International Search Report and Written Opinion for PCT/US2010/042916 dated Feb. 28, 2011.
Chinnam, R. B.; "On-Line Reliability Estimation of Physical Systems Using Neural Networks and Wavelets"; Smart Engineering System Design, vol. 4; p. 253-264, 2002.
Chinnam, R. B.; "On-Line Reliability Estimation for Individual Components Using Statistical Degradation Signal Models"; Qual. Reliab. Engng. Int. vol. 18; p. 53-73; 2002.

* cited by examiner

*Primary Examiner* — Jeffrey A Gaffin
*Assistant Examiner* — Ilya Traktovenko
(74) *Attorney, Agent, or Firm* — Cantor Colburn LLP

(57) ABSTRACT

A method for creating a risk estimate for a tool includes creating a plurality of source patterns from tool data and maintenance data related to a plurality of tools. The method also includes creating a risk model from the plurality of source patterns, the risk model including a plurality of example stressors each having an associated risk value. The method also includes creating at least one stress pattern from tool data related to the tool and comparing the at least one stress pattern to the risk model to create a risk estimate for the tool.

18 Claims, 5 Drawing Sheets

RISK ASSESSMENT FOR TOOLS

CROSS-REFERENCE TO RELATED APPLICATIONS AND PRIORITY CLAIM

This application claims the benefit of U.S. Provisional Application Ser. No. 61/227,525, entitled "RISK ASSESSMENT FOR TOOLS", filed Jul. 22, 2009, under 35 U.S.C. §119(e), which is incorporated herein by reference in its entirety.

BACKGROUND

The present invention relates generally to risk assessment and, in particular, utilizing nonparametric risk assessment to estimate a failure probability for tools.

Exploration and production of hydrocarbons or geothermal energy requires that accurate and precise measurements be performed on earth formations, which may contain reservoirs of the hydrocarbons or geothermal energy. Some of these measurements are performed at the surface of the earth and may be referred to as surveys. Other measurements are generally performed in boreholes penetrating the earth formations. The process of performing these measurements in boreholes is called "well logging."

In one example of well logging, a logging tool, used to perform the measurements, is lowered into a borehole and supported by a wireline. The logging tool contains various components that perform the measurements and record or transmit data associated with the measurements. Of course, the logging tool may be any tool that is may be utilized while drilling.

Various types of measurements can be performed in a borehole. One type of measurement that may be made relates to stresses to which the tool is exposed while in operation. These stresses may include, but are not limited to, lateral vibration, temperature and the length of time to which the tool is exposed to these stresses.

In traditional, reliability driven risk assessment, the reliability of a system is mostly defined as a function of time, where time may be quantified by elapsed time, use time, or number of cycles. While this approach has resulted in improvements in overall risk assessment in many different industries, it has limited viability in the drilling industry since tool health is heavily influenced by the stresses to which a tool is exposed.

Most reliability based risk analysis techniques are founded on the premise that, given a sample of failure times, it is possible to derive a probability distribution function that quantifies the reliability as a function of time. In such distributions, time is most often expressed in terms of use time, elapsed time, or as a number of cycles. From the distributions, it is possible to estimate a range of values such as reliability and failure probability. As used herein, the term "risk" may be used interchangeably with many different metrics related to reliability, such as reliability, failure probability, hazard rate, etc.

This approach has been successfully used in many industries, but the unique nature of the drilling industry is such that having a function that simply maps time to risk is not enough. For the most part, the implemented prior art methods have been limited to simple time based statistics that in no way account for the observed stresses. There has been some limited work related to incorporating different stress signals into the assessment process, but it has yet to produce a method that is capable of accurately estimating the risk of failure for an individual tool that has been exposed to a particular sequence of stresses.

SUMMARY

Disclosed is a method for creating a risk estimate for a tool that includes creating a plurality of source patterns from tool data and maintenance data related to a plurality of tools. The method also includes creating a risk model from the plurality of source patterns, the risk model including a plurality of example stressors each having an associated risk value. The method also includes creating at least one stress pattern from tool data related to the tool and comparing the at least one stress pattern to the risk model to create a risk estimate for the tool.

Also disclosed is computer program product for a risk estimate for a tool. The computer program product includes a tangible storage medium readable by a processing circuit and storing instructions for execution by the processing circuit for performing a method comprising: creating a plurality of source patterns from tool data and maintenance data related to a plurality of tools; creating a risk model from the plurality of source patterns, the risk model including a plurality of example stressors each having an associated risk value; creating at least one stress pattern from tool data related to the tool; and comparing the at least one stress pattern to the risk model to create a risk estimate for the tool.

These and other features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings, wherein like elements are numbered alike, in which:

DETAILED DESCRIPTION

The following description discloses systems and methods for estimating a risk of failure for a tool and, in particular, for a borehole tool. In one embodiment, the systems and methods utilize nonparametric methods for such estimates. Nonparametric methods refer to distribution-free methods that do not rely on assumptions that the data is drawn from a given probability distribution. As such, it is the opposite of parametric statistics.

In one embodiment, the systems and methods utilize example data from failed and unfailed tools to define a multivariate map that maps stress levels, operational times, etc., to risk. This map can then be used to assess current tool failure risk, estimate the run success probability by simulating different operational profiles, and perform many other tasks in the operational, maintenance, and planning processes. Furthermore, because the memory from which the maps may be constructed may be defined purely by real world data, it can easily be updated with additional data and adapted for different applications and signals.

Figure 1:
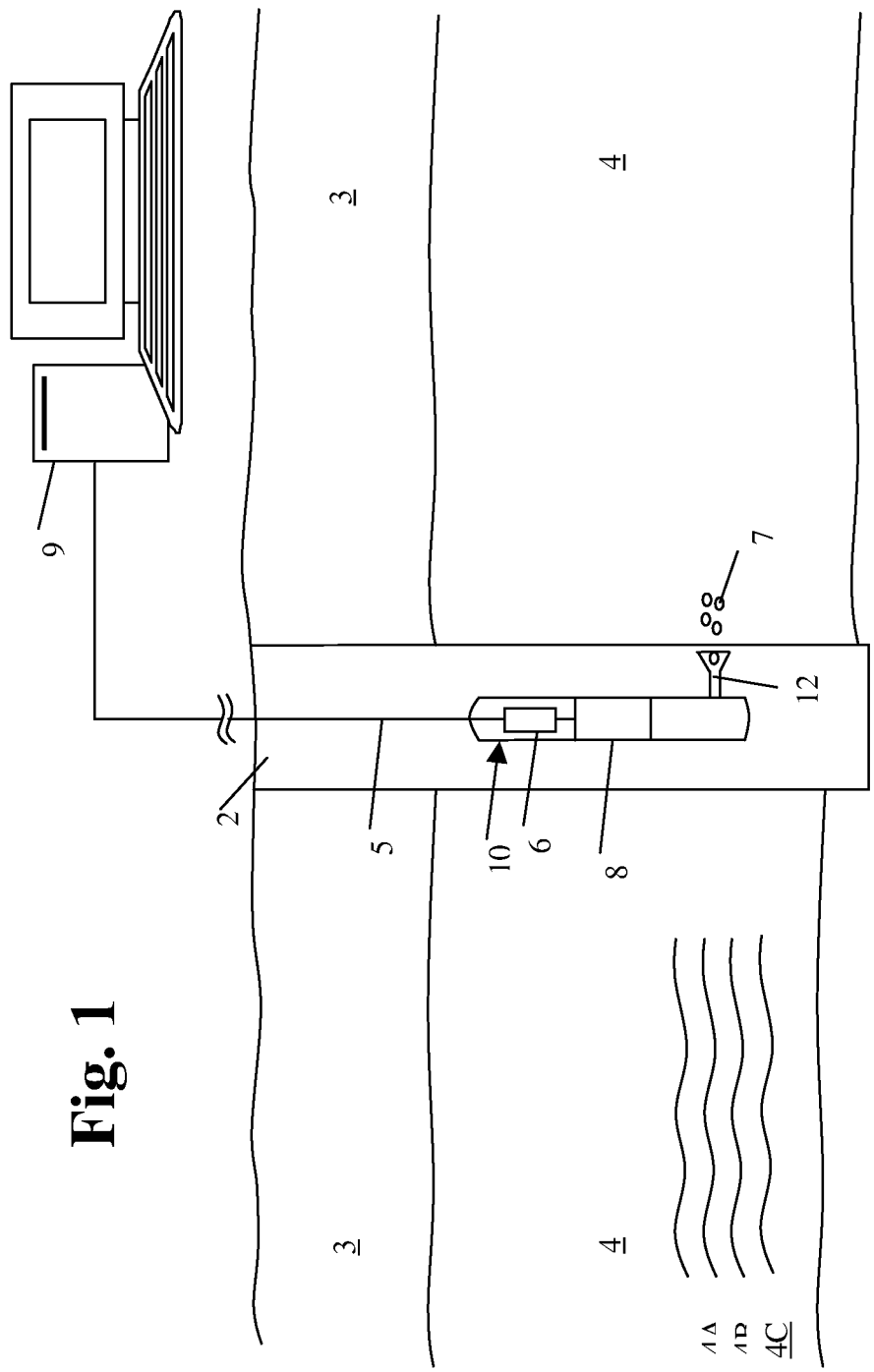
FIG. 1 illustrates an exemplary embodiment of a logging tool disposed in a borehole penetrating an earth formation.

Reference may now be had to FIG. 1, which illustrates an exemplary embodiment of a logging tool 10 disposed in a borehole 2 penetrating the earth 3. Within the earth 3 is a formation 4 that includes formation layers 4A-4C. The logging tool 10 is conveyed through the borehole 2 by an armored wireline 5. In the embodiment of FIG. 1, the logging tool 10 includes an extraction device 12 configured to extract a fluid 7 from the formation 4. The logging tool 10 includes an instrument 6. The instrument 6 includes a component used to perform a measurement of an operational property experienced by the logging tool 10.

The instrument 6 can also include electronic circuitry (not shown) for processing, recording, or transmitting measurements performed about the instrument 6 in operation. These measurements may include, but are not limited to, stresses experienced by the logging tool 10 during operation. These stresses may include, but are not limited to, accumulated vibration, maximum vibration, average vibration, average temperature, maximum temperature, and exposure times to any or all of these and other stresses. Of course, it shall be understood that "measuring" vibration may include measuring forces such as accelerations, weight, and bending moments torque experience by a down hole tool.

Embodiments of the invention disclosed herein may include two operations: training and execution. In general, the training portion may utilize historical memory dump data, operations data, and maintenance data related to particular tools to train a nonparametric risk model. The training may include, for example, utilizing examples or conditioned examples of different stressors and their associated risks. These examples may be combined to create stress patterns. The stress patterns can contain an endless combination of elements derived from signals and operational data. These can include, but are not limited to, the accumulated vibration, maximum vibration, average vibration, average temperature, maximum temperature, exposure times to different stresses and levels, etc.

The instrument 6 of logging tool 10 may provide information to a computing device 9. The computing device 9 could be any type of computing device capable of receiving and storing information received from the instrument 6. Of course, the instrument may provide the information to the computing device 9 in real time or the information may be loaded into the computing device at a later time. Regardless, it shall be understood that the system may include means for communication, either via wireline 5 or wireless, between the instrument 6 and the computing device 9.

It shall be understood from the description below that embodiments may allow for failure analysis based on real world borehole experience. This may allow for a more robust definition of out of specification criteria on the basis of expected risk. Embodiments may also allow for better informed rerun decisions, where the decision to use a particular tool 10 again may be based on the current risk or an estimate of the expected risk. Further, given an expected operational profile, online (real-time) risk analysis where observed stresses are actively used to inform the operator of failure risk according to one embodiment. Further, one embodiment may allow for run optimization where a particular run is modified to meet specific reliability targets based on expected risk.

The processing of the data may be done downhole (i.e., at the instrument 6 during operation) and the results transferred to the surface (i.e., to the computing device 9) later or data may be transferred to the surface in real time allowing for real time processing by the computing device 9.

Figure 2:
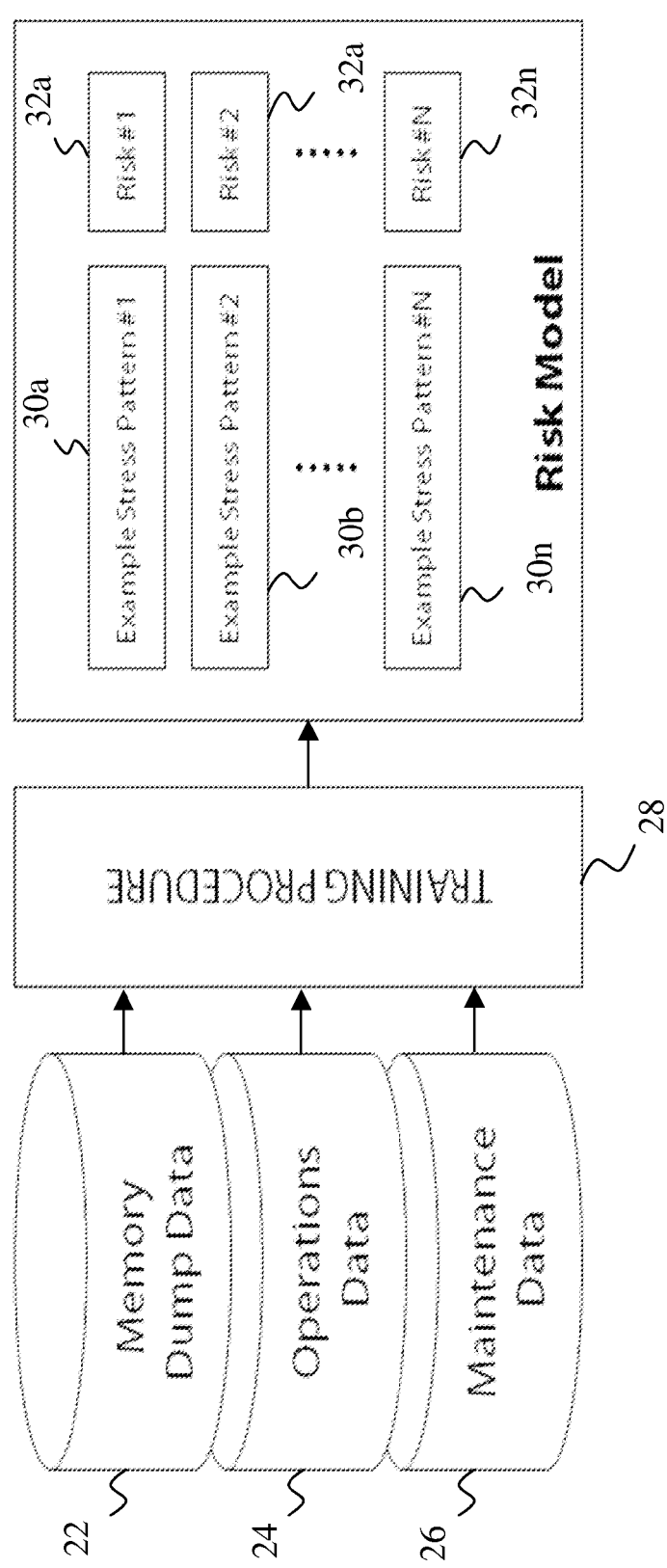
FIG. 2 is a block diagram of the creation of a risk model according to one embodiment of the present invention.

FIG. 2 shows a high-level data flow diagram for the creation of a risk model 20. This flow diagram may be considered part of the training process. The processing described herein may be performed, for example, by the computing device 9 (FIG. 1). In one embodiment, memory dump data 22, operations data 24 and maintenance data 26 for a plurality of different tools are processed by a training procedure 28. The memory dump data 22 and operations data 24 may be part of what is referred to herein as "tool data." Of course, tool data could refer to information related to the tool other than memory dump data 22 or operations data 24. The memory dump data 22 may be a record of information collected by the instrument about the operating conditions experienced by the logging tool. This could include, for example, accumulated vibration, maximum vibration, average vibration, average temperature, maximum temperature, exposure times to different stresses and levels, etc. The operations data 24 may be any type of data stored about the operation of the logging tool. For example, the operations data 24 could include the number times the logging tool has been used and for how long. The maintenance data 26 could include, for example, the maintenance records for the particular logging tool. The fact that maintenance occurred could be, in one embodiment, indicative that a failure occurred.

Of course, the memory dump data 22, the operations data 24 and the maintenance data 26 could be for multiple logging tools. As one of ordinary skill in the art will readily realize, the memory dump data 22, the operations data 24 and the maintenance data 26 could be stored in a computer memory, in individual sections (modules) within a computer memory or within a memory portion of a tool to which the data relates. The training procedure 28 is described in greater detail below and may, in one embodiment, be separately performed for each tool for which data exists.

The output of the training procedure 28 is a risk model 20. In one embodiment, the risk model 20 includes a plurality of stress patterns 30a-30n each of which includes an associated risk assessment 32a-32n. The risk model 20 may be used to create a risk estimate. The stress patterns 30a-30n may be created by combining different source patterns (source patterns are described with respect to FIG. 3). In one embodiment, the associated risk assessments 32a-32n may be expressed as a probabilistic expression of failure rate.

Figure 3:
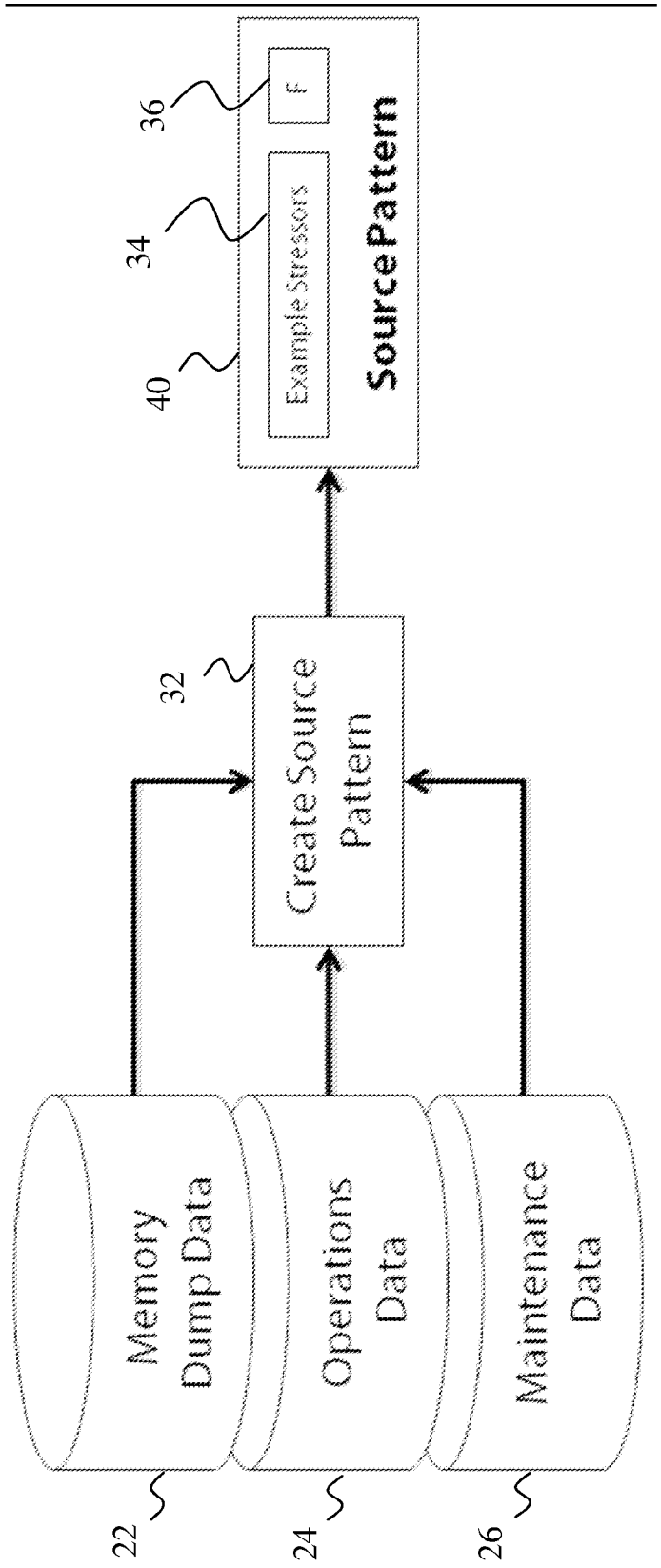
FIG. 3 is a data flow diagram showing the creation of a source pattern according to one embodiment.

FIG. 3 shows a data flow diagram for creating a source pattern 40 from various inputs. The inputs include, for example, memory dump data 22, the operations data 24 and the maintenance data 26. These inputs are processed by a source pattern creation routine 32. In general, the source pattern creation routine 32 utilizes, for each of the available example tools/runs stored in the memory dump data 22, operations data 24 and the maintenance data 26 to generate the example stressor 34 and a metric that quantifies failure 36. In most applications, the failure metric 36 will simply be a Boolean value, whose value is 1 for a failure and 0 otherwise. The generated pair of stressor pattern 34 and failure metric 36 for the present tool/run will be referred to as the source pattern 40.

The stressor pattern 34 may be any combination of two or more parameters to which a particular tool was exposed. For example, the stressor pattern 34 may be a combination of duration and level of tool vibration. Of course, other stresses could also be utilized such as, for example, lateral vibration, accumulated vibration, maximum vibration, average vibration, average temperature, maximum temperature, exposure times to different stresses and levels. Based on the stressor patterns 34, a particular tool may have either failed or not as may be shown, for example, in the maintenance data 26. Thus, each coupling of a pattern may generate, in one embodiment, either a "fail" or "functional" failure metric 36. The ranges of the two parameters may be varied and compared to the data from the memory units 22, 24, and 26. Thus, the source pattern 30 represents examples of operation from tools that were actually used.

Each individual run or tool history in the memory dump 22, operations data 24 and maintenance data 26 may be separately supplied to the source pattern creation routine 32 to produce M source patterns 40 where M is the number of tool histories or runs. In short, each source pattern may be a pairing of a particular stress and whether the tool failed.

Figure 4:
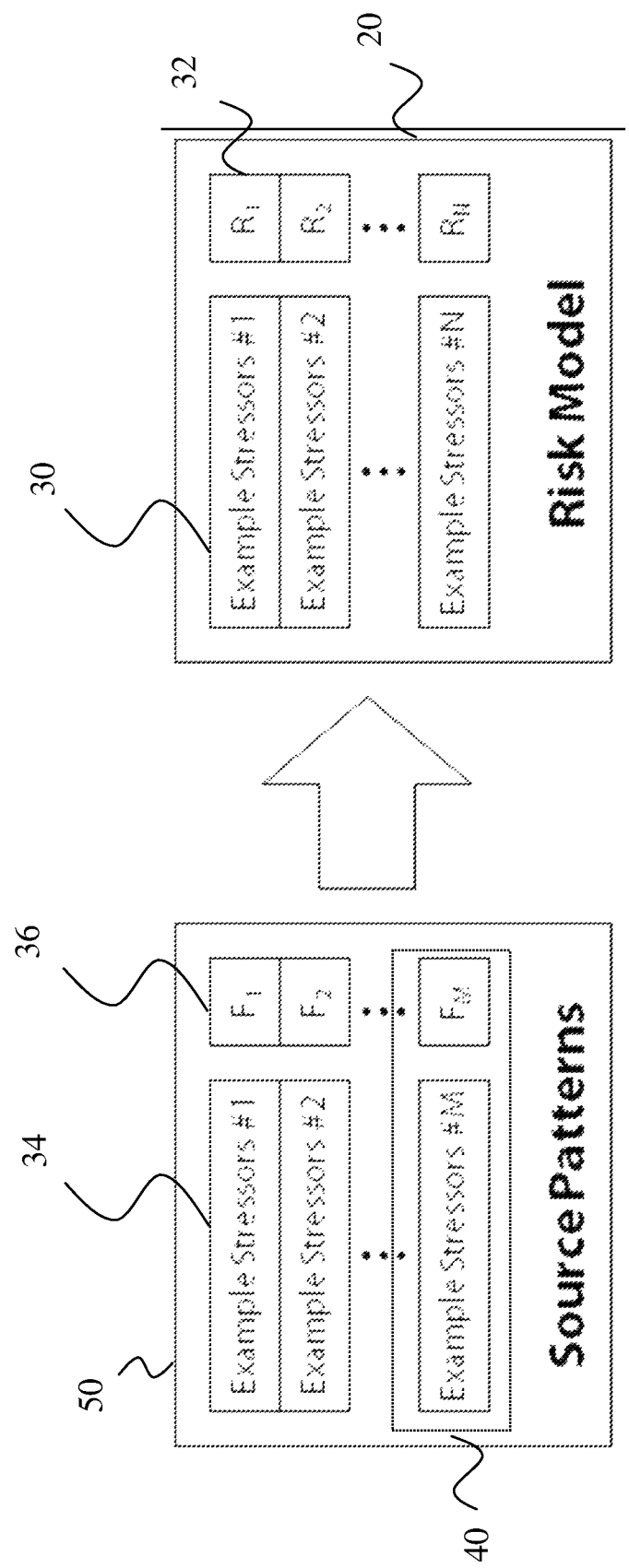
FIG. 4 is a block diagram showing generally the transformation from a collection of source patterns to a risk model according to one embodiment of the present invention.

FIG. 4 shows generally to conversion from the collection of M source patterns 50 to the risk model 20. The risk model 20, as described above, may include N example stressors 30 and each example stressor includes an associated risk value 32. In general, each source pattern 40 is a bin for a stress/failure pair. All of the matching (or similar) example stressors 34 may be grouped together to form a single risk stressor pattern 30 with an associated risk 32. The associated risk 32 for each risk stressor pattern 30 may be, for example, a numerical representation of the percentage of failures to the total number of example stressors 34. For example, if 47 tools were exposed to the same or similar stresses (i.e., 47 source patterns 40 in the collection of source patterns 50 are substantially similar) these stresses are grouped together. Then, if 15 of the source patterns indicated that a failure did occur, the risk estimate 32 for the particular risk stressor pattern 30 would be 15/47× 100=32%. Of course, different calculations could be employed.

Figure 5:
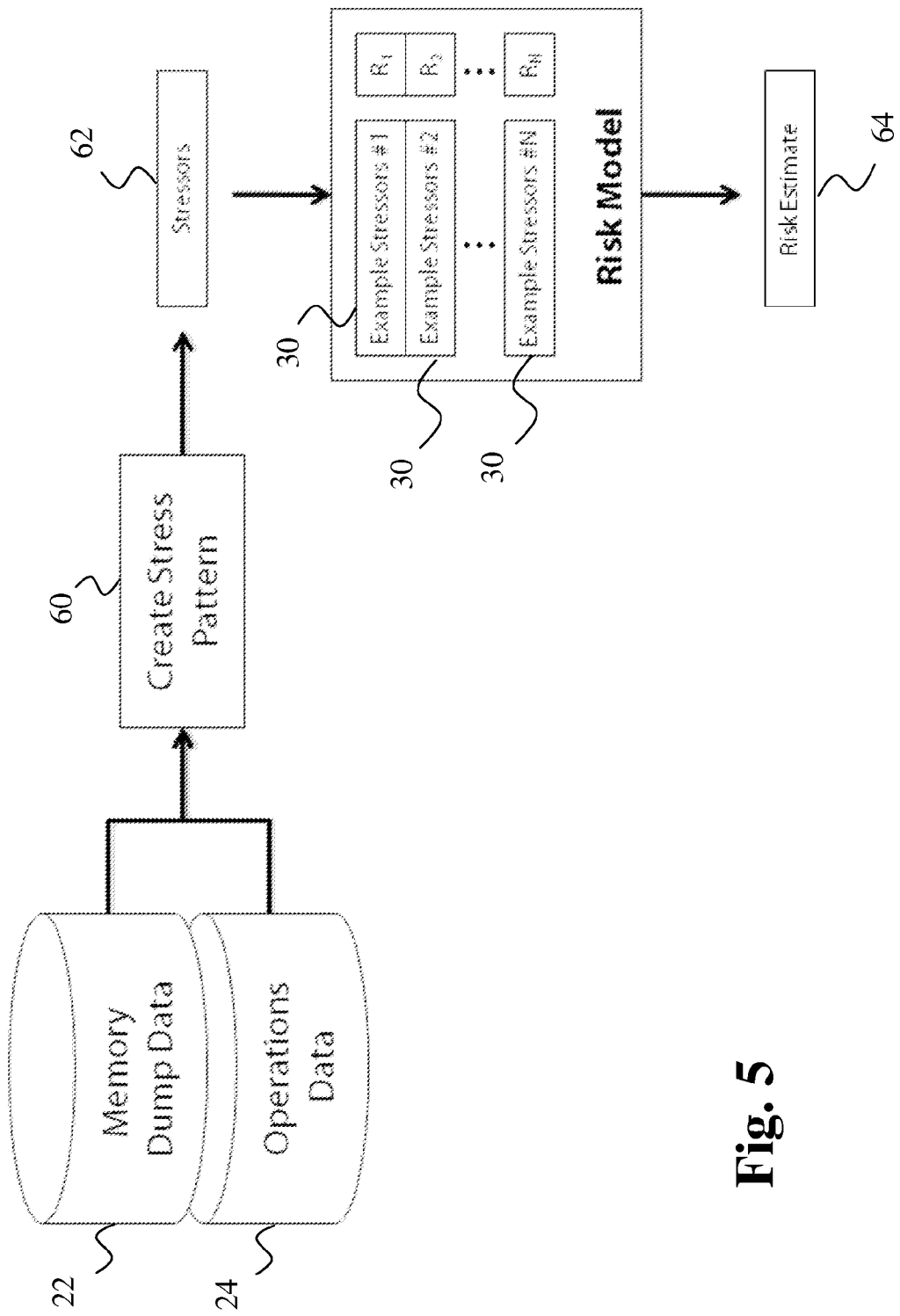
FIG. 5 is a data flow diagram showing the creation of a risk estimate for a particular tool.

FIG. 5 shows a data flow diagram of an operational phase of an embodiment of the present invention. In particular tool, the data stored in the memory dump data 22 and the operations data 24 are used by a stress pattern creator 60 (similar to the source pattern creator 32 described above) to create stress patterns 62. These stress patterns are for a particular tool of interest. The stress patterns 62 are then compared to each of the example stressors 30 of the risk model 20 to create a risk estimate 64. In one embodiment, the risk estimate 64 is a value that indicates likelihood of failure. Of course, the risk estimate 64 could also be expressed as a binary fail/not fail value.

In support of the teachings herein, various analysis components may be used, including a digital and/or an analog system. For example, the instrument 6 or the processing system 9 can include the digital and/or analog system. The system may have components such as a processor, storage media, memory, input, output, communications link (wired, wireless, pulsed mud, optical or other), user interfaces, software programs, signal processors (digital or analog) and other such components (such as discrete or integrated semiconductors, resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing for aspects of the teachings herein. For example, sample tubing, sample chamber, power supply (e.g., at least one of a generator, a remote supply and a battery), vacuum supply, pressure supply, cooling component, heating component, motive force (such as a translational force, propulsional force or a rotational force), magnet, electromagnet, sensor, electrode, transmitter, receiver, transceiver, antenna, controller, optical unit, electrical unit or electromechanical unit may be included in support of the various aspects discussed herein or in support of other functions beyond this disclosure.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While one or more embodiments have been shown and described, modifications and substitutions may be made thereto without departing from the spirit and scope of the invention. Accordingly, it is to be understood that the present invention has been described by way of illustrations and not limitation.

The invention claimed is:

1. A method for creating a risk estimate for a tool to be used in a plurality of runs, the method comprising:
    creating a plurality of source patterns from tool data and maintenance data related to a plurality of tools;
    creating a risk model from the plurality of source patterns, the risk model including a plurality of example stressors each having an associated risk value;
    creating at least one stress pattern from tool data related to the tool; and
    comparing the at least one stress pattern to the risk model to create a risk estimate for the tool that the tool will fail in a future one of the plurality of runs of the tool.

2. The method of claim 1, wherein the tool data is formed from at least operations data.

3. The method of claim 2, wherein the tool data is also formed from a record of operating conditions.

4. The method of claim 1, wherein the example stressors include at least one of: tool vibration, tool usage time, lateral vibration, accumulated vibration, maximum vibration, average vibration, average temperature, maximum temperature and exposure times.

5. The method of claim 1, wherein the associated risk value is a binary value.

6. The method of claim 1, wherein the risk estimate indicates a likelihood of failure of the tool.

7. The method of claim 1, wherein the tool data and maintenance data are received from a database.

8. The method of claim 1, wherein the tool is a borehole tool.

9. The method of claim 8, wherein the tool data is created while drilling is performed with the tool.

10. A computer program product for a forming a risk estimate for a tool to be used in a plurality of runs, comprising a non-transitory tangible storage medium readable by a processing circuit and storing instructions for execution by the processing circuit for performing a method comprising:
    creating a plurality of source patterns from tool data and maintenance data related to a plurality of tools;
    creating a risk model from the plurality of source patterns, the risk model including a plurality of example stressors each having an associated risk value;
    creating at least one stress pattern from tool data related to the tool; and
    comparing the at least one stress pattern to the risk model to create a risk estimate for the tool that the tool will fail in a future one of the plurality of runs of the tool.

11. The computer program product of claim 10, wherein the tool data is formed from at least operations data.

12. The computer program product of claim 11, wherein the tool data is also formed from a record of operating conditions.

13. The computer program product of claim 10, wherein the example stressors include at least one of tool vibration, tool usage time, lateral vibration, accumulated vibration, maximum vibration, average vibration, average temperature, maximum temperature and exposure times.

14. The computer program product of claim 10, wherein the associated risk value is a binary value.

15. The computer program product of claim 10, wherein the risk estimate indicates a likelihood of failure of the tool.

16. The computer program product of claim 10, wherein the tool data and maintenance data are received from a database.

17. The computer program product of claim 10, wherein the tool is a borehole tool.

18. The computer program product of claim 17, wherein the tool data is created while drilling performed with the tool.

* * * * *